(12) United States Patent
You et al.

(10) Patent No.: US 12,237,391 B2
(45) Date of Patent: Feb. 25, 2025

(54) SEMICONDUCTOR DEVICE INCLUDING A FIELD EFFECT TRANSISTOR AND A METHOD OF FABRICATING THE SEMICONDUCTOR DEVICE

(71) Applicant: SAMSUNG ELECTRONICS CO., LTD., Suwon-si (KR)

(72) Inventors: Junggun You, Ansan-si (KR); Beomjin Park, Hwaseong-si (KR); Sughyun Sung, Yongin-si (KR); Hojin Lee, Hwaseong-si (KR); Dongwon Kim, Seongnam-si (KR); Donggyu Lee, Suwon-si (KR); Myoung-Sun Lee, Seoul (KR); Keun Hwi Cho, Seoul (KR); Hanbyul Choi, Suwon-si (KR); Jiyong Ha, Seoul (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 436 days.

(21) Appl. No.: 17/851,289

(22) Filed: Jun. 28, 2022

(65) Prior Publication Data
US 2023/0139574 A1    May 4, 2023

(30) Foreign Application Priority Data

Nov. 2, 2021   (KR) .................. 10-2021-0148967

(51) Int. Cl.
*H01L 29/423* (2006.01)
*H01L 29/66* (2006.01)
*H01L 29/786* (2006.01)

(52) U.S. Cl.
CPC .... *H01L 29/42392* (2013.01); *H01L 29/6656* (2013.01); *H01L 29/78618* (2013.01); *H01L 29/78696* (2013.01)

(58) Field of Classification Search
CPC .......... H01L 29/42392; H01L 29/6656; H01L 29/78618; H01L 29/78696
See application file for complete search history.

(56) References Cited

U.S. PATENT DOCUMENTS

| 6,097,049 A | 8/2000 | Goebel et al. |
| 10,032,886 B2 | 7/2018 | Chung et al. |

(Continued)

FOREIGN PATENT DOCUMENTS

| KR | 10-0615735 | 8/2006 |
| KR | 10-0707208 | 4/2007 |

(Continued)

*Primary Examiner* — Timor Karimy
(74) *Attorney, Agent, or Firm* — F. CHAU & ASSOCIATES, LLC

(57) ABSTRACT

A semiconductor device includes: an active pattern on a substrate, wherein the active pattern includes a plurality of channel layers stacked on one another; a plurality of source/drain patterns spaced apart from each other in a first direction and disposed on the active pattern, wherein the plurality of source/drain patterns are connected to each other through the plurality of channel layers; and first and second gate electrodes at least partially surrounding the channel layers and extending in a second direction, wherein the second direction intersects the first direction, wherein the active pattern has a first sidewall and a second sidewall that faces the first sidewall, and wherein a first distance between the first sidewall of the active pattern and an outer sidewall of the first gate electrode is different from a second distance between the second sidewall of the active pattern and an outer sidewall of the second gate electrode.

20 Claims, 16 Drawing Sheets

(56) References Cited

U.S. PATENT DOCUMENTS

| | | |
|---|---|---|
| 10,050,107 B1 | 8/2018 | Cheng et al. |
| 10,170,366 B2 | 1/2019 | You et al. |
| 10,276,566 B2 | 4/2019 | Afzalian |
| 10,453,752 B2 | 10/2019 | Van Dal et al. |
| 10,680,107 B2 | 6/2020 | Cheng |
| 10,685,966 B2 | 6/2020 | Liaw |
| 10,957,761 B2 | 3/2021 | Yeh et al. |
| 2007/0145431 A1 | 6/2007 | Kim et al. |
| 2007/0181959 A1 | 8/2007 | Park et al. |
| 2020/0135851 A1* | 4/2020 | Lin .................... H01L 29/4983 |
| 2021/0043730 A1* | 2/2021 | Lee .................... H01L 29/7851 |

FOREIGN PATENT DOCUMENTS

| | | |
|---|---|---|
| KR | 10-0718149 | 5/2007 |
| KR | 10-1772278 | 8/2017 |
| KR | 10-2072029 | 1/2020 |

* cited by examiner

SEMICONDUCTOR DEVICE INCLUDING A FIELD EFFECT TRANSISTOR AND A METHOD OF FABRICATING THE SEMICONDUCTOR DEVICE

CROSS-REFERENCE TO RELATED APPLICATION

This U.S. nonprovisional application claims priority under 35 U.S.C. § 119 to Korean Patent Application No. 10-2021-0148967 filed on Nov. 2, 2021 in the Korean Intellectual Property Office, the disclosure of which is incorporated by reference herein in its entirety.

TECHNICAL FIELD

The present inventive concept relates to a semiconductor device, and more particularly, to a semiconductor device including a field effect transistor and a method of fabricating the same.

DISCUSSION OF THE RELATED ART

Generally, a semiconductor device includes an integrated circuit including, for example, metal oxide semiconductor field effect transistors (MOSFETs). As sizes and design rules of the semiconductor device are gradually decreased, sizes of the MOSFETs are also increasingly scaled down. However, as MOSFETs are scaled down, operating characteristics of the semiconductor device may deteriorate. Accordingly, various studies have been conducted for developing methods of fabricating semiconductor devices having increased performances while overcoming limitations caused by high integration of the semiconductor devices.

SUMMARY

According to an exemplary embodiment of the present inventive concept, a semiconductor device includes: an active pattern on a substrate, wherein the active pattern includes a plurality of channel layers that are stacked on one another and spaced apart from each other; a plurality of source/drain patterns that are spaced apart from each other in a first direction and are disposed on the active pattern, wherein the plurality of source/drain patterns are connected to each other through the plurality of channel layers; and first and second gate electrodes that at least partially surround the channel layers and extend in a second direction while extending across the active pattern, wherein the first and second gate electrodes are disposed adjacent to the plurality of source/drain patterns, wherein the second direction intersects the first direction, wherein the active pattern has a first sidewall and a second sidewall that faces the first sidewall, and wherein a first distance between the first sidewall of the active pattern and an outer sidewall of the first gate electrode is different from a second distance between the second sidewall of the active pattern and an outer sidewall of the second gate electrode.

According to an exemplary embodiment of the present inventive concept, a semiconductor device includes: an active pattern on a substrate, wherein the active pattern includes a plurality of channel layers that are stacked and spaced apart from each other; a plurality of source/drain patterns spaced apart from each other in a first direction and disposed on the active pattern, wherein the plurality of source/drain patterns are connected to each other through the channel layers; and first to third gate electrodes that at least partially surround the channel layers and extend in a second direction while extending across the active pattern, wherein the first to third gate electrode are disposed between the plurality of source/drain patterns, wherein the second direction intersects the first direction, wherein the active pattern has a first sidewall and a second sidewall that faces the first sidewall, wherein each of the first sidewall and the second sidewall has a curved shape that is rounded toward an adjacent one of the plurality of source/drain patterns, wherein the first gate electrode is adjacent to the first sidewall, wherein the second gate electrode is adjacent to the second sidewall, wherein the third gate electrode is between the first gate electrode and the second gate electrode, and wherein a first distance between the first sidewall and an outer sidewall of the first gate electrode is less than a second distance between the second sidewall and an outer sidewall of the second gate electrode.

According to an exemplary embodiment of the present inventive concept, a semiconductor device includes: a plurality of active patterns on a substrate, wherein each of the active patterns includes a plurality of channel layers that are stacked and spaced apart from each other; a plurality of source/drain patterns spaced apart from each other in a first direction and disposed on the plurality of active patterns, wherein the plurality of source/drain patterns are connected to each other through the plurality of channel layers; first to third gate electrodes at least partially surrounding the channel layers and extending in a second direction across the plurality of active patterns, wherein the plurality of source/drain patterns are disposed between the first to third gate electrodes, wherein the second direction intersects the first direction; a gate dielectric pattern between the first to third gate electrodes and the plurality of channel layers; a plurality of first gate spacers vertically extending from a top surface of an uppermost one of the channel layers and covering sidewalls of each of the first to third gate electrodes; a plurality of second gate spacers between the plurality of source/drain patterns and the first to third gate electrodes, wherein the plurality of second gate spacers vertically overlap the plurality of first gate spacers; a plurality of gate capping patterns between the plurality of first gate spacers and on the first to third gate electrodes; an interlayer dielectric layer covering sidewalls and top surfaces of the plurality of first gate spacers and top surfaces of the plurality of gate capping patterns; a plurality of active contacts on opposite sides of each of the first to third gate electrodes, wherein the active contacts penetrate the interlayer dielectric layer and are connected to the plurality of source/drain patterns; and a gate contact penetrating the interlayer dielectric layer to connect to one of the first to third gate electrodes, wherein the plurality of active patterns are spaced apart from each other in the second direction by a first trench, and are spaced apart from each other in the first direction by a second trench, wherein each of the plurality of active patterns has a first sidewall and a second sidewall that faces the first sidewall, wherein each of the first sidewall and the second sidewall has a curved shape that is rounded toward an adjacent one of the plurality of source/drain patterns, wherein the first gate electrode is adjacent to the first sidewall, wherein the second gate electrode is adjacent to the second sidewall, wherein the third gate electrode is between the first gate electrode and the second gate electrode, and wherein a first distance between the first sidewall and an outer sidewall of the first gate electrode is less than a second distance between the second sidewall and an outer sidewall of the second gate electrode.

DETAILED DESCRIPTION OF THE EMBODIMENTS

Exemplary embodiments of the present inventive concept will now be described more fully with reference to the accompanying drawings.

Figure 1A:
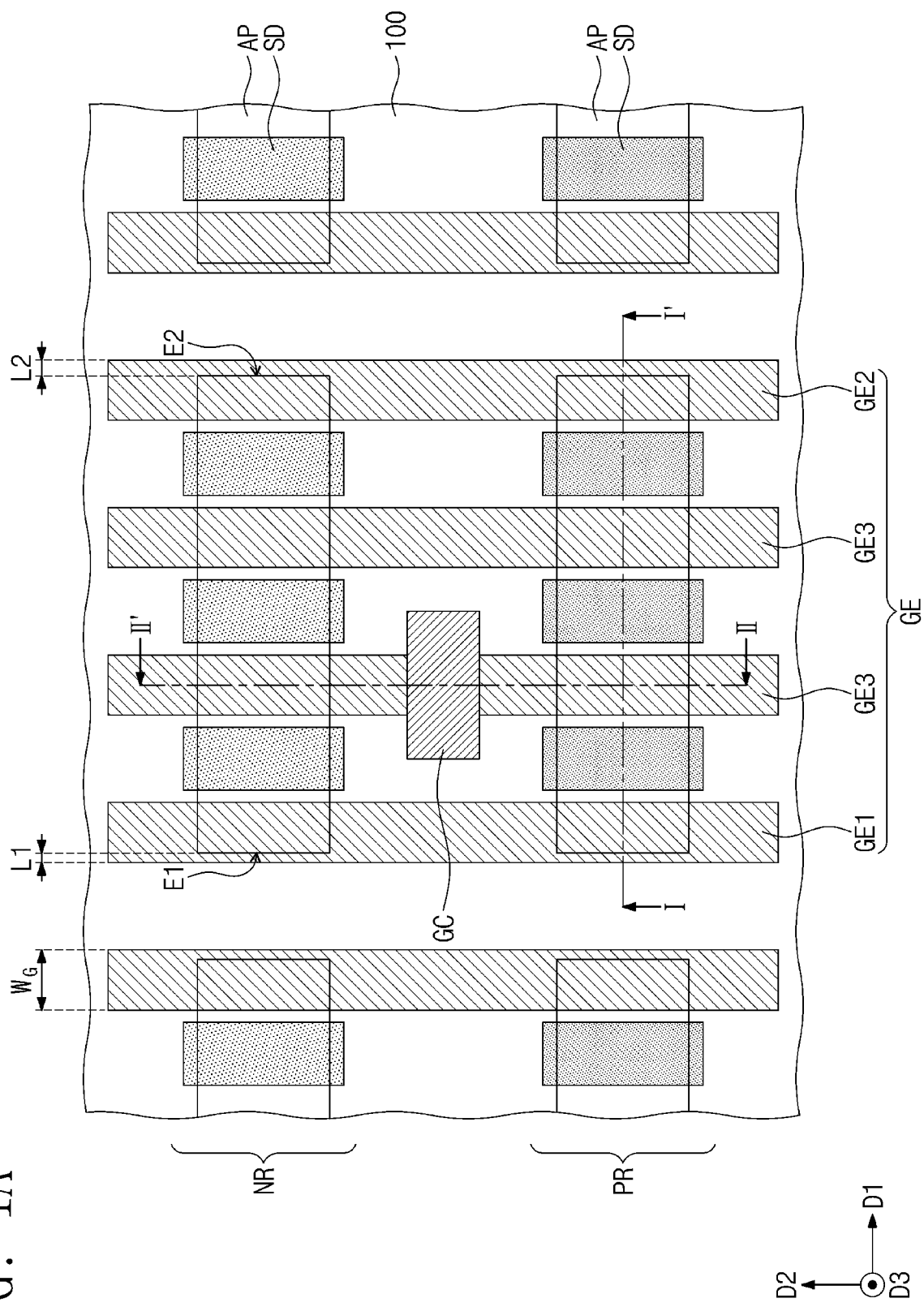
FIG. 1A illustrates a plan view showing a semiconductor device according to an exemplary embodiment of the present inventive concept.
Figure 1B:
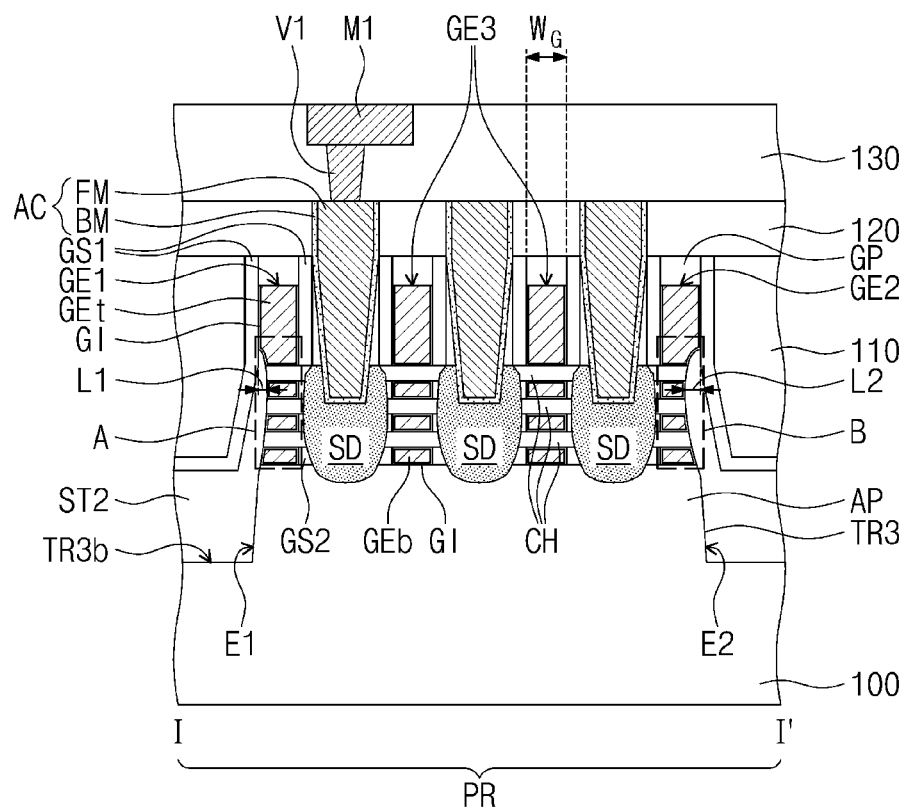
FIGS. 1B and 1C illustrate cross-sectional views respectively taken along lines I-I' and II-II' of FIG. 1A, illustrating a semiconductor device according to an exemplary embodiment of the present inventive concept.
Figure 1B:
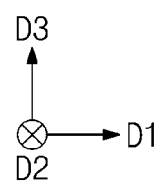
Figure 1C:
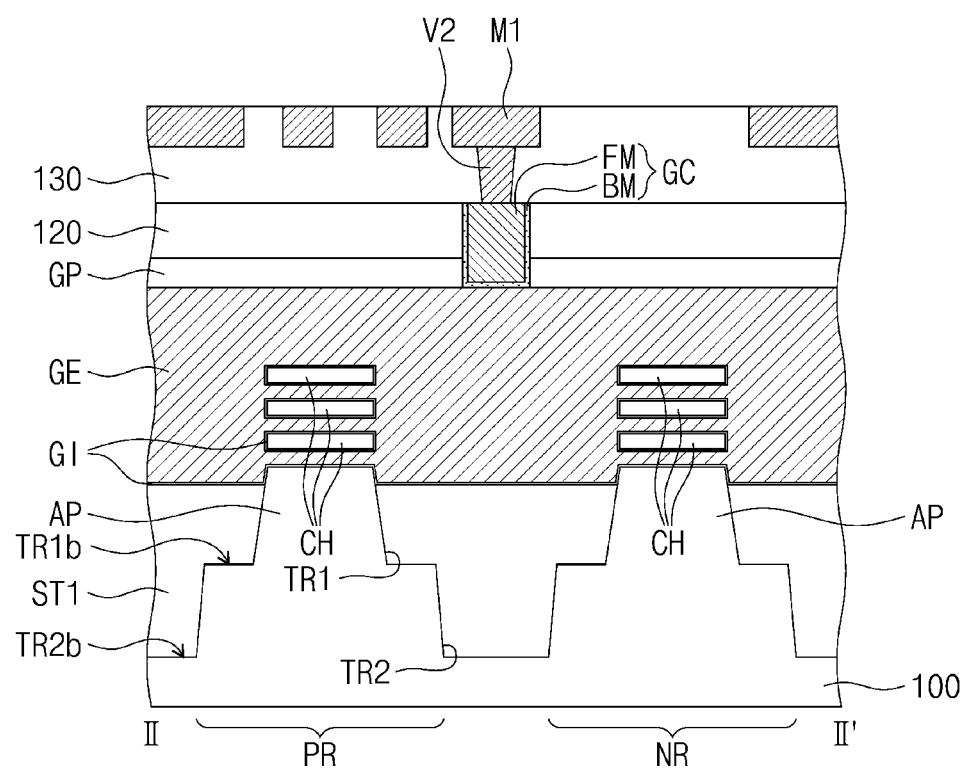
Figure 1C:
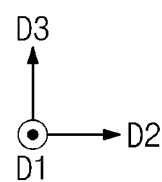

FIG. 1A illustrates a plan view illustrating a semiconductor device according to an exemplary embodiment of the present inventive concept. FIGS. 1B and 1C illustrate cross-sectional views respectively taken along lines I-I' and II-II' of FIG. 1A, illustrating a semiconductor device according to an exemplary embodiment of the present inventive concept.

Referring to FIGS. 1A, 1B, and 1C, a substrate 100 may be provided and may include a first cell region PR and a second cell region NR. The substrate 100 may be a compound semiconductor substrate or a semiconductor substrate including one of, for example, silicon (Si), germanium (Ge), or silicon-germanium (SiGe). For example, the substrate 100 may be a silicon substrate. The substrate 100 may have a top surface that is parallel to a first direction D1 and a second direction D2, and a third direction D3 is substantially perpendicular to the top surface of the substrate 100. The first, second, and third directions D1, D2, and D3 may be orthogonal to one another.

The first cell region PR and the second cell region NR may be defined by a second trench TR2 that is formed on an upper portion of the substrate 100. The second trench TR2 may be positioned between the first cell region PR and the second cell region NR. The first cell region PR and the second cell region NR may be spaced apart from each other in the second direction D2 with the second trench TR2 therebetween. For example, the second trench TR2 may extend in the first direction D1.

The first cell region PR and the second cell region NR may each be an area in which a standard cell, which constitutes a logic circuit, is provided. For example, the first cell region PR may be an area in which PMOS field effect transistors are provided, and the second cell region NR may be an area in which NMOS field effect transistors are provided.

Active patterns AP may be defined by a first trench TR1 formed on the upper portion of the substrate 100. The active patterns AP may be provided on the first cell region PR and the second cell region NR. The first trench TR1 may be shallower than the second trench TR2. For example, the first trench TR1 may have a bottom surface TR1$b$ located at a higher level than that of a bottom surface TR2$b$ of the second trench TR2. For example, the first trench TR1 may overlap the second trench TR2. The active patterns AP may extend in the first direction D1 and may be spaced apart from each other in the second direction D2. The active patterns AP may be portions protruding from the substrate 100 in the third direction D3. The active patterns AP may each have widths in the first direction D1 and the second direction D2, and the widths may decrease in the third direction D3 away from the bottom surface TR1$b$ thereof.

A first device isolation layers ST1 may fill the first and second trenches TR1 and TR2. The first device isolation layer ST1 may include, for example, silicon oxide. Each of the active patterns AP may have an upper portion that protrudes upwardly from the first device isolation layer ST1. The first device isolation layer ST1 might not cover the upper portion of each of the active patterns AP. The first device isolation layer ST1 may partially cover a sidewall of each of the active patterns AP.

The active patterns AP in the first cell region PR may be spaced apart from each other in the first direction D1 by a third trench TR3. The active patterns AP in the second cell region NR may also be spaced apart from each other in the first direction D1 by the third trench TR3. The third trench TR3 may be shallower than the first trench TR1. For example, the third trench TR3 may have a bottom surface TR3$b$ located at a higher level than that of the bottom surface TR2$b$ of the second trench TR2. For example, the bottom surface TR3$b$ of the third trench TR3 may be located at substantially the same height as that of the bottom surface TR1$b$ of the first trench TR1.

A second device isolation layer ST2 may fill the third trench TR3. The second device isolation layer ST2 may include, for example, silicon oxide. The second device isolation layer ST2 may extend along sidewalls of channel layers CH and along a sidewall of a bottom electrode GEb of one of gate electrodes GE which will be discussed below. At least a portion of the second device isolation layer ST2 may protrude upwardly from a top surface of an uppermost one of channel layers CH which will be discussed below, and may overlap in the first direction D1 with a portion of a top electrode GEt of one of gate electrodes GE which will be discussed below.

Each of the active patterns AP may include a plurality of channel layers CH. The channel layers CH may be provided on the upper portion of each of the active patterns AP. The channel layers CH may be spaced apart from each other in the third direction D3. The channel layers CH may include, for example, one of silicon (Si), germanium (Ge), or silicon-germanium (SiGe). For example, the channel layers CH may include silicon (Si).

Each of the active patterns AP may have source/drain patterns SD on the upper portion thereof. For example, the source/drain patterns SD may be impurity regions having a first conductivity type (e.g., p-type) or a second conductivity type (e.g., n-type). The channel layers CH may be provided between a pair of source/drain patterns SD. The source/drain patterns SD may be epitaxial patterns formed by a selective epitaxial growth process.

The source/drain patterns SD may include a semiconductor material (e.g., SiGe) whose lattice constant is greater than that of a semiconductor material included in the substrate 100, or the source/drain patterns SD may include a semiconductor material (e.g., Si) whose lattice constant is the same as that of a semiconductor material included in the substrate 100. The second source/drain patterns SD2 may provide the channel layers CH with compressive stress.

A plurality of gate electrodes GE may be provided to run across the active patterns AP and extend in the second direction D2. The gate electrodes GE may be spaced apart from each other in the first direction D1. Each of the gate electrodes GE may overlap in the third direction D3 with the channel layers CH. Each of the gate electrodes GE may include a top electrode GEt and a bottom electrode GEb. The top electrode GEt may be provided on an uppermost one of the channel layers CH, and the bottom electrode GEb may be provided between the channel layers CH. Each of the top and bottom electrodes GEt and GEb may be a portion of a single unitary electrode. The bottom electrode GEb of each of the gate electrodes GE may extend between the channel layers CH and in the second direction D2 parallel to a bottom surface of the top electrode GEt. For example, the bottom electrode GEb may extend below the lowermost channel layer CH. Each of the gate electrodes GE may cover top surfaces, bottom surfaces, and sidewalls of the channel layers CH. Each of transistors on the first and second cell regions PR and NR may be a three-dimensional field effect transistor (or gate-all-around type transistor) in which each of the gate electrodes GE three-dimensionally at least partially surrounds the channel layers CH.

The gate electrodes GE may include one or more of doped semiconductor materials, conductive metal nitrides, and metals. For example, each of the gate electrodes GE may include a plurality of different metal patterns. The plurality of metal patterns may have different resistances from each other. A composition and/or thickness of each of the plurality of metal patterns may be adjusted to achieve desired threshold voltages for transistors.

Each of the active patterns AP may have a first sidewall E1 and a second sidewall E2 that faces in the first direction D1 toward the first sidewall E1. The gate electrodes GE may include a first gate electrode GE1, a second gate electrode GE2 and a third gate electrode GE3. The first gate electrode GE1 may be adjacent to the first sidewall E1. The second gate electrode GE2 may be adjacent to the second sidewall E2, and the third gate electrode GE3 may be between the first gate electrode GE1 and the second gate electrode GE2. For example, the third gate electrode GE3 may be provided in plural.

The first sidewall E1 might not be aligned with a sidewall of the top electrode GEt that is included in the first gate electrode GE. The second sidewall E2 might not be aligned with a sidewall of the top electrode Get that is included in the second gate electrode GE2. For example, each of the first and second sidewalls E1 and E2 may have a portion that has a curved shape or concave shape that is rounded or protruding toward the source/drain pattern SD adjacent thereto. For example, the first sidewall E1 may have a curvature different from that of the sidewall E2. The second device isolation layer ST2 may extend along the first sidewall E1 or the second sidewall E2.

A first distance L1 may be a maximum distance between the first sidewall E1 and an outer sidewall of the top electrode GEt included in the first electrode GE1 (e.g., the outer sidewall is a sidewall that is remote or furthest, among the sidewalls of the top electrode GEt, from the source/drain pattern SD or the active contact AC). A second distance L2 may be a maximum distance between the second sidewall E2 and an outer sidewall of the top electrode GEt included in the second gate electrode GE2. The first distance L1 and the second distance L2 may be measured in the first direction D1. However, the present inventive concept is not limited thereto. For example, the first distance L1 may be the same as the second distance L2.

The first distance L1 may be different from the second distance L2. It is illustrated by way of example that the second distance L2 is greater than the first distance L1, but this is merely an example and the present inventive concept is not limited thereto. Each of the first and second distances L1 and L2 may be less than a width WG in the first direction D1 of each of the gate electrodes GE. For example, each of the first and second distances L1 and L2 may be less than half of the width WG in the first direction D1 of each of the gate electrodes GE.

First gate spacers GS1 and second gate spacers GS2 may be provided on sidewalls of the gate electrodes GE. The first gate spacers GS1 may extend in the second direction D2 along the sidewalls of the gate electrodes GE. Each of the first gate spacers GS1 may extend in the third direction D3 from a top surface of an uppermost one of the channel layers CH. The first gate spacers GS1 may have their top surfaces located at a higher level than that of top surfaces of the gate electrodes GE (or that of a top surface of the top electrode GEt included in each of the gate electrodes GE). For example, the top surface of each of the first gate spacers GS1 may be substantially coplanar with that of the gate capping patterns GP. For example, the first gate spacers GS1 may include a nitride-based dielectric material. The first gate spacers GS1 may include, for example, at least one of SiCN, SiCON, and/or SiN. In addition, the first gate spacers GS1 may include a multi-layer formed of at least two of SiCN, SiCON, and/or SiN.

The first gate spacer GS1, which covers the outer sidewall of each of the first and second gate electrodes GE1 and GE2 (e.g., the outer sidewall is a sidewall that is remote or furthest, among the sidewalls of the first and second gate electrodes GE1 and GE2, from the source/drain pattern SD or the active contact AC), may extend downwardly from a bottom surface of the top electrode GEt of each of the first and second gate electrodes GE1 and GE2 (or, from the top surface of the uppermost channel layer CH of the channel layers CH). In addition, the first gate spacer GS1 may extend along a top surface of the second device isolation layer ST2. The first gate spacer GS1, which extends along the top surface of the second device isolation layer ST2, may have a bottom surface located at a level lower than that of a top surface of the active pattern AP adjacent thereto. However, the present inventive concept is not limited thereto. For example, the bottom surface of the first gate spacer GS1 may be located above or at substantially the same level as that of the top surface of the active pattern AP.

The second gate spacers GS2 may be horizontally provided between the source/drain patterns SD and the bottom electrode GEb of each of the gate electrodes GE. The second gate spacers GS2 may be vertically provided between the channel layers CH, and may overlap in the third direction D3 with the first gate spacers GS1. Each of the gate electrodes GE may be spaced apart in the first direction D1 from the source/drain patterns SD with the second gate spacers GS2 disposed therebetween.

A gate capping pattern GP may be provided on each of the gate electrodes GE. The gate capping pattern GP may extend in the second direction D2 along the gate electrode GE. The gate capping pattern GP may include a material having an etch selectivity with respect to first and second interlayer dielectric layers 110 and 120 which will be discussed below. The gate capping pattern GP may include, for example, at least one of SiON, SiCN, SiCON, and/or SiN.

A gate dielectric pattern GI may be interposed between the gate electrode GE and the channel layers CH. The gate dielectric pattern GI may extend between the gate electrode GE and the first gate spacers GS1 and between the gate electrode GE and the second gate spacers GS2. The gate dielectric pattern GI may extend between the bottom electrode GEb of the gate electrode GE and a sidewall of the second device isolation layer ST2 adjacent to the bottom electrode GEb. The gate dielectric pattern GI may have an uppermost surface substantially coplanar with that of the gate electrode GE. The gate electrode GE may be spaced apart from the first and second gate spacers GS1 and GS2 with the gate dielectric pattern GI disposed therebetween. The bottom electrode GEb of the gate electrode GE may be spaced apart from the second device isolation layer ST2 with the gate dielectric pattern GI disposed therebetween.

The gate dielectric pattern GI may include, for example, at least one of silicon oxide, silicon nitride, silicon oxynitride, and/or high-k dielectric. The high-k dielectric may include a material, such as hafnium oxide (HfO), aluminum oxide (AlO), or tantalum oxide (TaO), whose dielectric constant is greater than that of silicon oxide and that of silicon nitride.

A first interlayer dielectric layer 110 may be provided on the substrate 100. The first interlayer dielectric layer 110 may cover top surfaces of the first and second device isolation layers ST1 and ST2, sidewalls of the first gate spacers GS1, sidewalls of the active contacts AC, and top surfaces and sidewalls of the source/drain patterns SD. The first interlayer dielectric layer 110 may have a top surface located at substantially the same level as that of the top surface of the gate capping pattern GP and that of the top surfaces of the first gate spacers GS1. The first interlayer dielectric layer 110 may be provided on the substrate 100, and a second interlayer dielectric layer 120 may cover the top surface of the gate capping pattern GP and the top surfaces of the first gate spacers GS1. The first and second interlayer dielectric layers 110 and 120 may include, for example, silicon oxide.

Active contacts AC may penetrate the first and second interlayer dielectric layers 110 and 120 and electrically connect to corresponding source/drain patterns SD. A pair of active contacts AC may be provided on opposite sides of each of the gate electrodes GE. When viewed in plan, each of the active contacts AC may have a linear or rectangular shape that extends in the second direction D2.

Each of the active contacts AC may include a conductive pattern FM and a barrier pattern BM that at least partially surrounds the conductive pattern FM. For example, the conductive pattern FM may include at least one of aluminum, copper, tungsten, molybdenum, and/or cobalt. The barrier pattern BM may cover a sidewall and a bottom surface of the conductive pattern FM. The barrier pattern BM may include a metal layer and a metal nitride layer. The metal layer may include at least one of, for example, titanium, tantalum, tungsten, nickel, cobalt, and/or platinum. The metal nitride layer may include at least one of, for example, titanium nitride (TiN), tantalum nitride (TaN), tungsten nitride (WN), nickel nitride (NiN), cobalt nitride (CoN), and/or platinum nitride (PtN).

The active contacts AC may be self-aligned contacts. For example, the gate capping pattern GP and the first gate spacers GS1 may be used to form the active contacts AC in a self-alignment manner. For example, the active contacts AC may cover at least portions of the sidewalls of the first gate spacers GS1. According to an exemplary embodiment of the present inventive concept, the active contacts AC may cover portions of the top surfaces of the gate capping patterns GP.

A silicide pattern may be provided between each of the active contacts AC and each of the source/drain patterns SD. Each of the active contacts AC may be electrically connected through the silicide pattern to one of the source/drain patterns SD. The silicide pattern may include metal silicide. The silicide pattern may include, for example, at least one of titanium silicide, tantalum silicide, tungsten silicide, nickel silicide, and/or cobalt silicide.

A gate contact GC may be provided to penetrate the second interlayer dielectric layer 120 and the gate capping pattern GP and to electrically connect to at least one of the gate electrodes GE. According to an exemplary embodiment of the present inventive concept, the gate contact GC may be provided on the first device isolation layer ST1 between the first cell region PR and the second cell region NR. When viewed in plan, the gate contact GC may have a linear or rectangular shape that extends in the first direction D1. Similar to the active contact AC, the gate contact GC may include a conductive pattern FM and a barrier pattern BM that at least partially surrounds the conductive pattern FM.

A third interlayer dielectric layer 130 may be provided on the second interlayer dielectric layer 120. The third interlayer dielectric layer 130 may be provided on the second interlayer dielectric layer 120 with first lines M1, the first via V1, and a second via V2 disposed in the second interlayer dielectric layer 120. The first and second vias V1 and V2 may be provided below the first lines M1. The first lines M1 may extend in the first direction D1. The first lines M1 may be arranged along the first direction D1 or the second direction D2. The first via V1 may lie between and electrically connect one of the first lines M1 and one of the active contacts AC to each other. The second via V2 may lie between and electrically connect the gate contact GC and one of the first lines M1 to each other.

The first lines M1 and one of the first and second vias V1 and V2 may be integrally connected into a single conductive structure. For example, the first lines M1 may be formed simultaneously with one of the first or second vias V1 or V2. A dual damascene process may be performed such that the first lines M1 and one of the first or second vias V1 or V2 may be formed into a single conductive structure. According to an exemplary embodiment of the present inventive concept, metal layers (e.g., M2, M3, M4, etc.) may be additionally stacked on the third interlayer dielectric layer 130.

Figure 2:
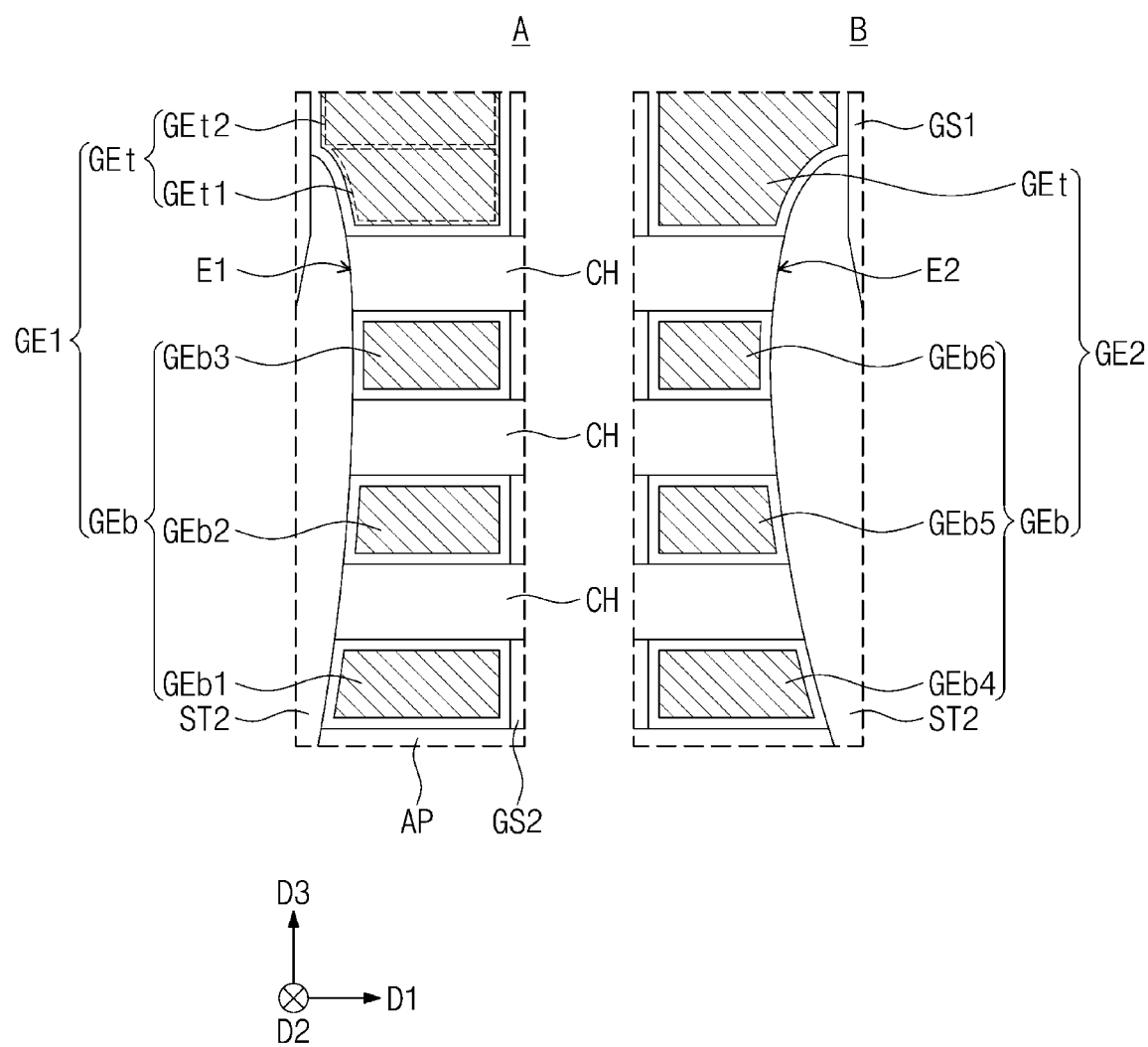
FIG. 2 illustrates an enlarged cross-sectional view of sections A and B of FIG. 1B, partially illustrating a semiconductor device according to an exemplary embodiment of the present inventive concept.

FIG. 2 illustrates an enlarged cross-sectional view of sections A and B of FIG. 1B, partially illustrating a semiconductor device according to an exemplary embodiment of the present inventive concept.

FIG. 2 partially depicts the first gate electrode GE1, which is adjacent to the first sidewall E1, and the second gate electrode GE2, which is adjacent to the second sidewall E2.

In the following description, a width may be a maximum or average width in the first direction D1.

Referring to section A of FIG. 2, the first gate electrode GE1 may include a bottom electrode GEb and a top electrode GEt. The bottom electrode GEb of the first gate electrode GE1 may include a first part GEb1, a second part GEb2, and a third part GEb3 that are sequentially stacked with the channel layers CH therebetween. The first part GEb1, the second part GEb2, and the third part GEb3 of the bottom electrode GEb may be spaced apart, in the third direction D3, from each with the channel layers CH therebetween. The first part GEb1, the second part GEb2, and the third part GEb3 may have different widths from each other. For example, the width of the first part GEb1 may be greater than that of the second part GEb2, and the width of the second part GEb2 may be greater than that of the third part GEb3.

Each of the first, second, and third parts GEb1, GEb2, and GEb3 of the bottom electrode GEb included in the first gate electrode GE1 may have a sidewall with a curved shape that is rounded along a profile of the first sidewall E1.

The top electrode GEt of the first gate electrode GE1 may include a first part GEt1 and a second part Get2. The first part Get1 may be adjacent to the bottom electrode GEb, and the second part GEt2 may be disposed on the first part GEt1. The first part GEt1 of the top electrode GEt may overlap in the first direction D1 with the second device isolation layer ST2. The second part GEt2 of the top electrode GEt may have a width greater than that of the first part GEt1 of the top electrode GEt.

Referring to section B of FIG. 2, the second gate electrode GE2 may include a bottom electrode GEb and a top electrode GEt. The second gate electrode GE2 may include a fourth part GEb4, a fifth part GEb5, and a sixth part GEb6 that are sequentially stacked with the channel layers CH therebetween. The fourth part GEb4, the fifth part GEb5, and the sixth part GEb6 of the bottom electrode GEb may be spaced apart from each other in the third direction D3 with the channel layers CH therebetween. The fourth part GEb4, the fifth part GEb5, and the sixth part GEb6 may have different widths from each other. For example, the width of the fourth part GEb4 may be greater than that of the fifth part GEb5, and the width of the fifth part GEb5 may be greater than that of the sixth part GEb6.

Each of the fourth, fifth, and sixth parts GEb4, GEb5, and GEb6 of the bottom electrode GEb included in the second gate electrode GE2 may have a sidewall with a curved shape that is rounded along a profile of the second sidewall E2.

In comparison with sections A and B of FIG. 2, the first part GEb1 of the bottom electrode GEb included in the first gate electrode GE1 may be located at substantially the same height as that of the fourth part GEb4 of the bottom electrode GEb included in the second gate electrode GE2. In the following description, the phrase "components having their thickness in the third direction D3 are located at the same level" may mean that top surfaces of the components are located at the same level, and that bottom surfaces of the components are also located at the same level. The first part GEb1 of the bottom electrode GEb included in the first gate electrode GE1 may have a width different from that of the fourth part GEb4 of the bottom electrode GEb included in the second gate electrode GE2. For example, the width of the first part GEb1 of the bottom electrode GEb included in the first gate electrode GE1 may be greater than that of the fourth part GEb4 of the bottom electrode GEb included in the second gate electrode GE2.

In addition, the second part GEb2 of the bottom electrode GEb included in the first gate electrode GE1 may be located at substantially the same level as that of the fifth part GEb5 of the bottom electrode GEb included in the second gate electrode GE2. The width of the second part GEb2 of the bottom electrode GEb included in the first gate electrode GE1 may be different from that of the fifth part GEb5 of the bottom electrode GEb included in the second gate electrode GE2 For example, the width of the second part GEb2 of the bottom electrode GEb included in the first gate electrode GE1 may be greater than that of the fifth part GEb5 of the bottom electrode GEb included in the second gate electrode GE2.

In addition, the third part GEb3 of the bottom electrode GEb included in the first gate electrode GE1 may be located at substantially the same level as that of the sixth part GEb6 of the bottom electrode GEb included in the second gate electrode GE2. The third part GEb3 of the bottom electrode GEb included in the first gate electrode GE1 may have a width different from that of the sixth part GEb6 of the bottom electrode GEb included in the second gate electrode GE2. For example, the width of the third part GEb3 of the bottom electrode GEb included in the first gate electrode GE1 may be greater than that of the sixth part GEb6 of the bottom electrode GEb included in the second gate electrode GE2.

The top electrode GEt of the second gate electrode GE2 may have a structure substantially the same as that of the top electrode GEt of the first gate electrode GE1. For example, at least a portion of the top electrode GEt of the second gate electrode GE2 may overlap in the first direction D1 with the second device isolation layer ST2 adjacent thereto.

Figure 3:
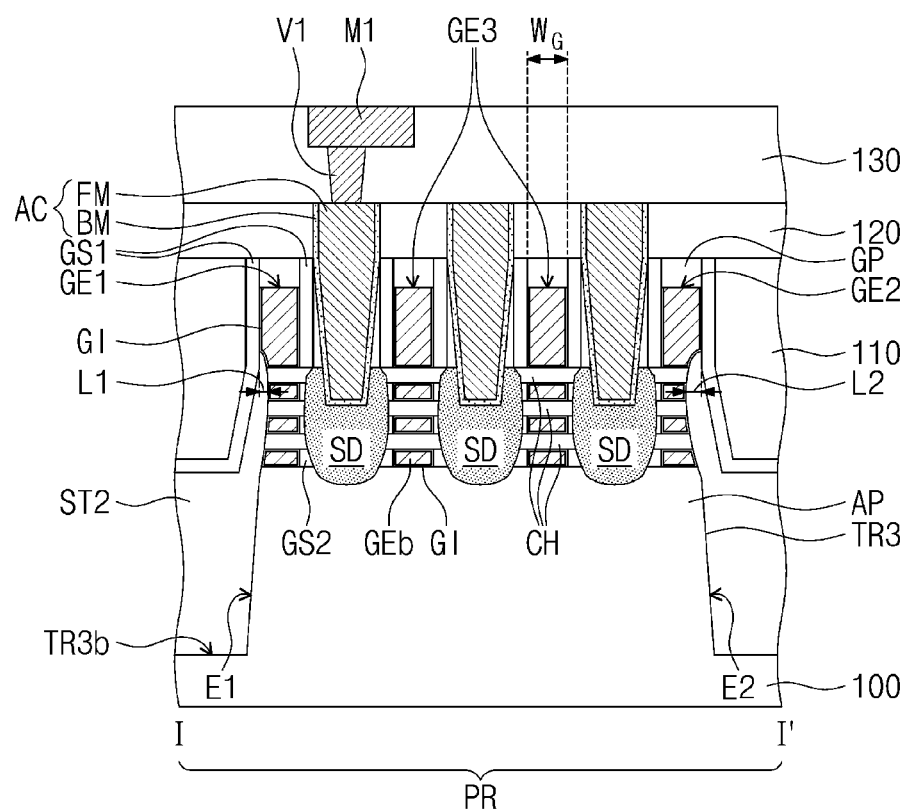
FIGS. 3 and 4 illustrate cross-sectional views taken along line I-I' of FIG. 1A, illustrating a semiconductor device according to an exemplary embodiment of the present inventive concept.

FIG. 3 illustrates a cross-sectional views taken along line I-I' of FIG. 1A, illustrating a semiconductor device according to an exemplary embodiment of the present inventive concept. For the sake of convenience of explanation, the same technical features as those discussed above will not be repeated herein, and the following description will focus on differences between previous and present embodiments.

Referring to FIGS. 1C and 3, the third trench TR3 may be deeper than the first trench TR1. In this case, the bottom surface TR3$b$ of the third trench TR3 may be located at a level lower than that of the bottom surface TR1$b$ of the first trench TR1. For example, the bottom surface TR3$b$ of the third trench TR3 may be located at substantially the same level as that of the bottom surface TR2$b$ of the second trench TR2.

Figure 4:
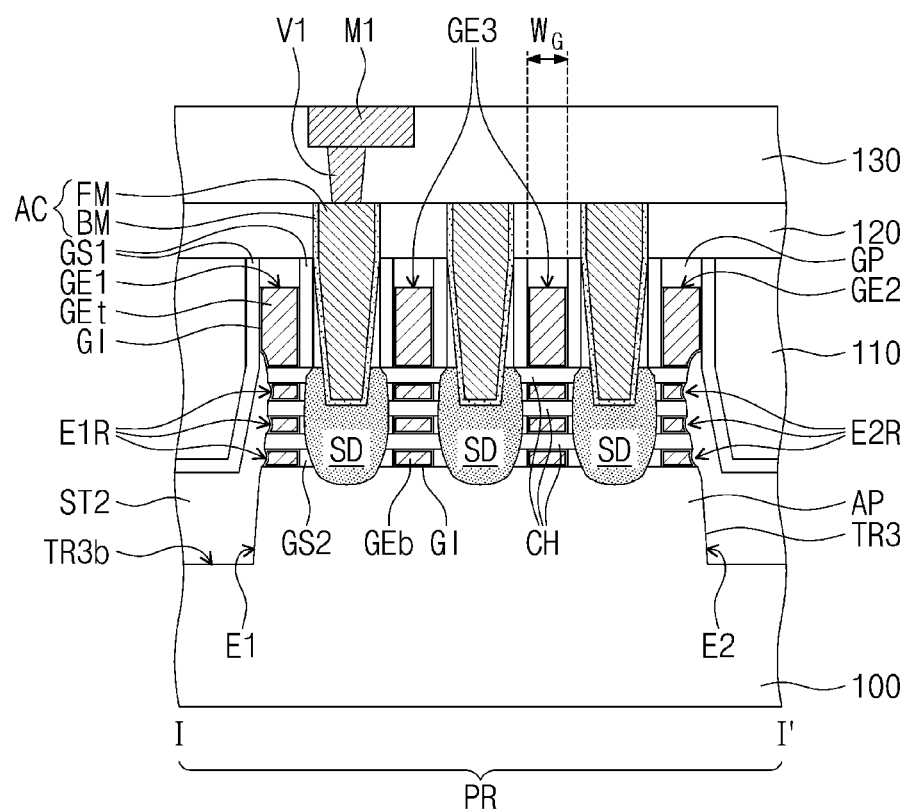
Figure 4:
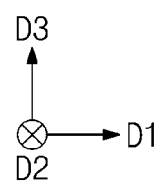

FIG. 4 illustrates a cross-sectional views taken along line I-I' of FIG. 1A, illustrating a semiconductor device according to an exemplary embodiment of the present inventive concept. For the sake of convenience of explanation, the same technical features as those discussed above will not be repeated herein, and the following description will focus on differences between previous and present embodiments.

Referring to FIG. 4, the first sidewall E1 may have first recessed portions E1R. For example, the first recessed portions E1R may be more recessed than the sidewalls of adjacent channel layers CH in a direction toward the source/drain pattern SD. For example, the side surfaces of the bottom electrode GEb may be recessed toward the source/drain pattern SD.

Similar to the first sidewall E1, the second sidewall E2 may have second recessed portions E2R. The second recessed portions E2R may be more recessed than the sidewalls of adjacent channel layers CH in a direction toward the source/drain pattern SD.

For example, each of the first and second sidewalls E1 and E2 may have an embossed curved shape. The bottom electrode GEb of each of the first and second gate electrodes GE1 and GE2 may have a sidewall with a curved shape that is rounded along the first recessed portions E1R or the second recessed portions E2R.

FIGS. 5A, 6A, 7A, and 8A illustrate plan views illustrating a method of fabricating a semiconductor device according to an exemplary embodiment of the present inventive concept. FIGS. 5B, 6B, 7B, and 8B illustrate cross-sectional views taken along line I-I' of FIGS. 5A, 6A, 7A, and 8A, respectively, illustrating a method of fabricating a semiconductor device according to an exemplary embodiment of the present inventive concept. FIGS. 5C and 8C illustrate cross-sectional views taken along line II-II' of FIGS. 5A and 8A, respectively, illustrating a method of fabricating a semiconductor device according to an exemplary embodiment of the present inventive concept.

With reference to FIGS. 5A to 8C, the following will describe in detail a method of fabricating a semiconductor device according to an exemplary embodiment of the present inventive concept.

Figure 5A:
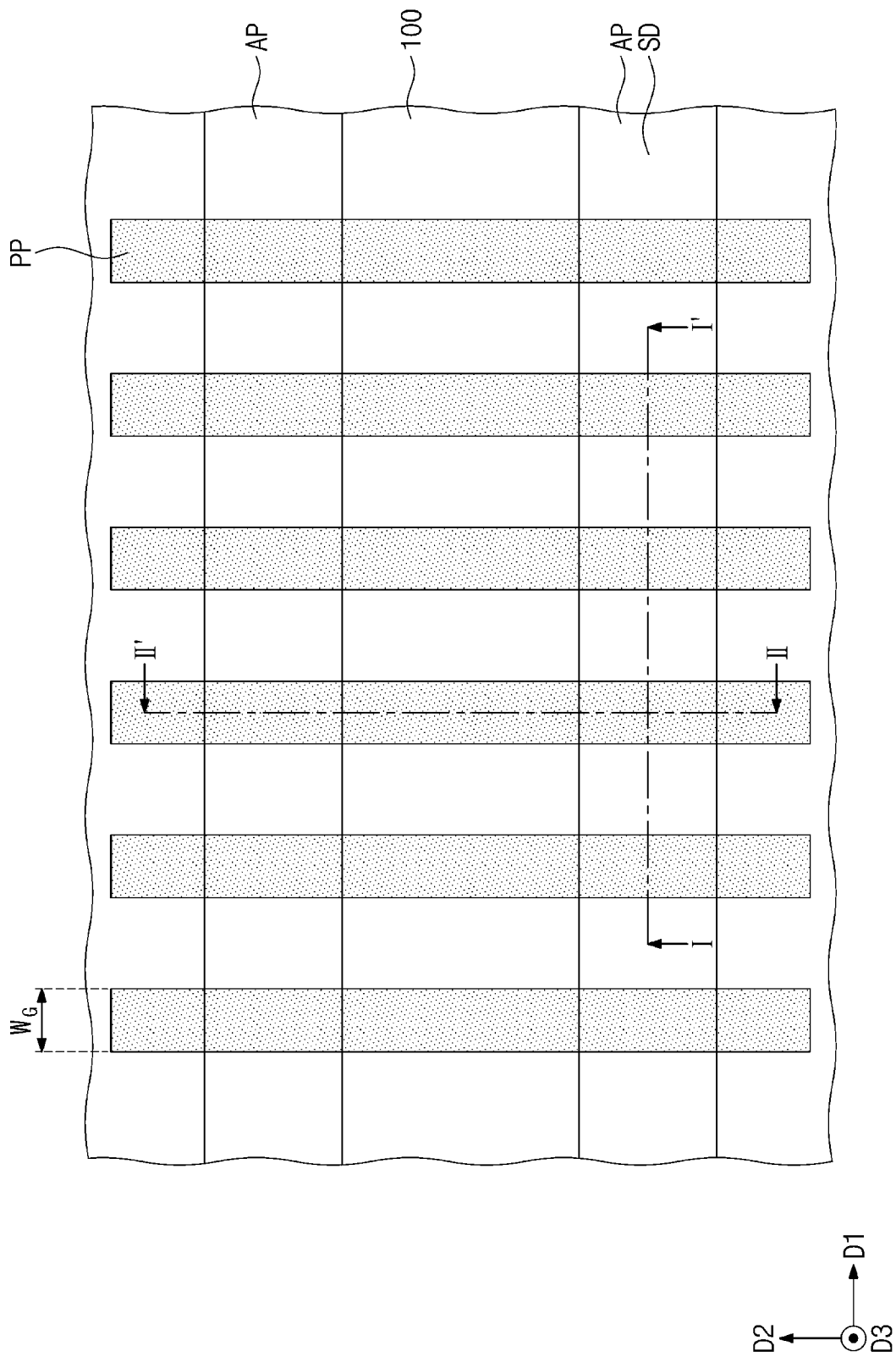
FIGS. 5A, 6A, 7A, and 8A illustrate plan views illustrating a method of fabricating a semiconductor device according to an exemplary embodiment of the present inventive concept.
Figure 5B:
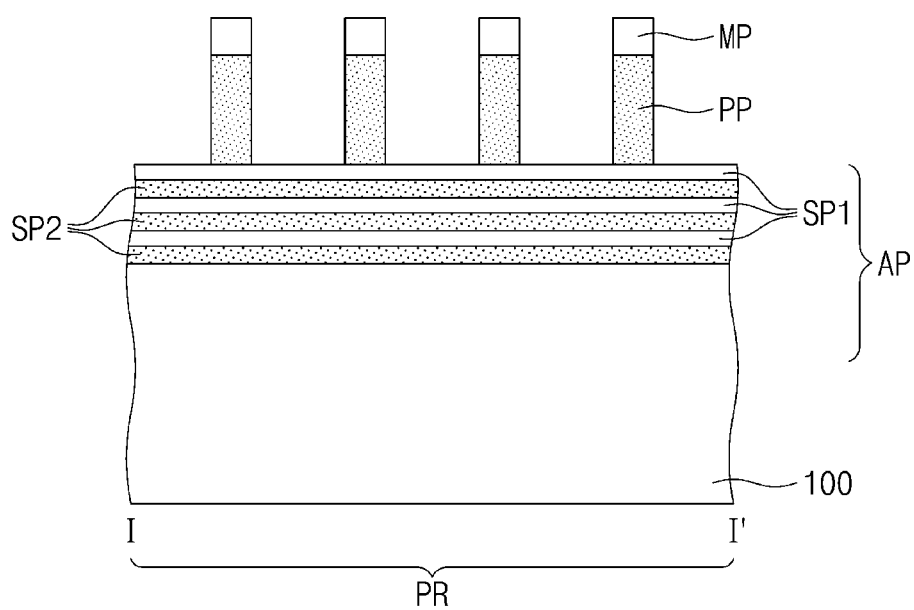
FIGS. 5B, 6B, 7B, and 8B illustrate cross-sectional views taken along line I-I' of FIGS. 5A, 6A, 7A, and 8A, respectively, illustrating a method of fabricating a semiconductor device according to an exemplary embodiment of the present inventive concept.
Figure 5B:
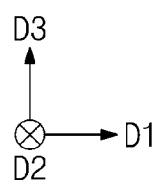
Figure 5C:
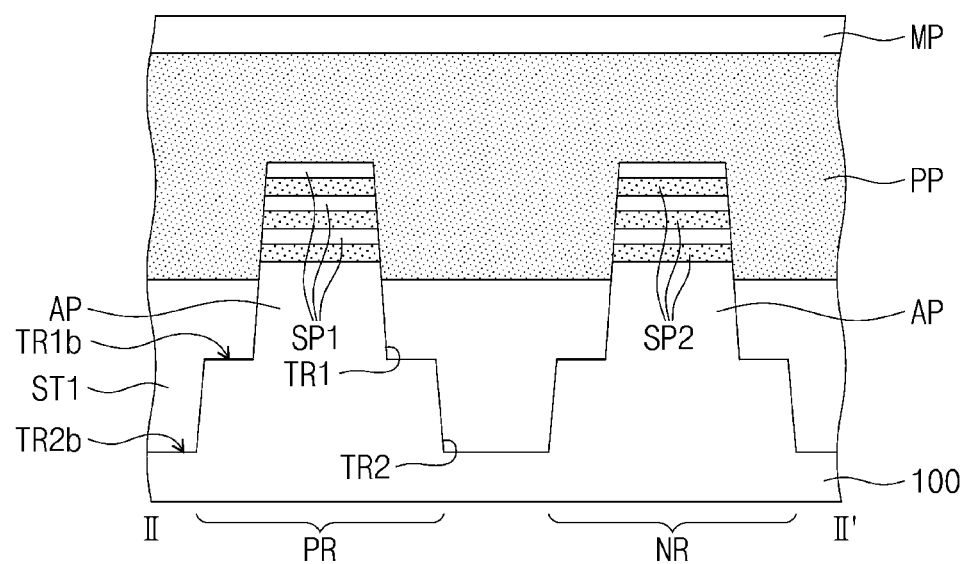
FIGS. 5C and 8C illustrate cross-sectional views taken along line II-II' of FIGS. 5A and 8A, respectively, illustrating a method of fabricating a semiconductor device according to an exemplary embodiment of the present inventive concept.

Referring to FIGS. 5A, 5B, and 5C, a substrate 100 may be provided and may include a semiconductor material. In addition, the substrate 100 may have a polygonal shape (e.g., a square shape or rectangular shape) extending in a first direction D1 and a second direction D2. For example, first semiconductor layers and second semiconductor layers may be alternately and repeatedly stacked on the substrate 100. The first semiconductor layers may include one of, for example, silicon (Si), germanium (Ge), and silicon-germanium (SiGe), or the second semiconductor layers may include another of, for example, silicon (Si), germanium (Ge), or silicon-germanium (SiGe). For example, the first semiconductor layers may include silicon (Si), and the second semiconductor layers may include silicon-germanium (SiGe).

A first etching process may be performed to form a first trench TR1 that provides active patterns AP. During the first etching process, the first and second semiconductor layers may be patterned to respectively form first semiconductor patterns SP1 and second semiconductor patterns SP2. The first and second semiconductor patterns SP1 and SP2 may be alternately and repeatedly stacked on each of the active patterns AP.

A second etching process may be patterned to form a second trench TR2 that provides a first cell region PR and a second cell region NR. The second trench TR2 may be formed deeper than the first trench TR1. For example, the second trench TR2 may have a bottom surface TR2b located at a level lower than that of a bottom surface TR1b of the first trench TR1. Active pattern AP may be correspondingly formed on the first cell region PR and the second cell region NR.

A first device isolation layer ST1 may be formed to fill the first and second trenches TR1 and TR2. The first device isolation layer ST1 may include a dielectric material, such as silicon oxide. The first device isolation layer ST1 may be recessed until upper portions of the active patterns AP are exposed. The upper portions of the active patterns AP may protrude upwardly in a third direction D3 from the first device isolation layer ST1.

A plurality of sacrificial patterns PP may be formed to extend across the active patterns AP. The sacrificial patterns PP may be spaced apart from each other in a first direction D1. Each of the sacrificial patterns PP may be formed to have a linear or rectangular shape that extends in a second direction D2.

The formation of the sacrificial patterns PP may include forming a sacrificial layer on the substrate 100, forming a hardmask pattern MP on the sacrificial layer, and using the hardmask pattern MP as an etching mask to pattern the sacrificial layer. The sacrificial layer may include, for example, polysilicon. The hardmask pattern MP may include, for example, silicon nitride.

Figure 6A:
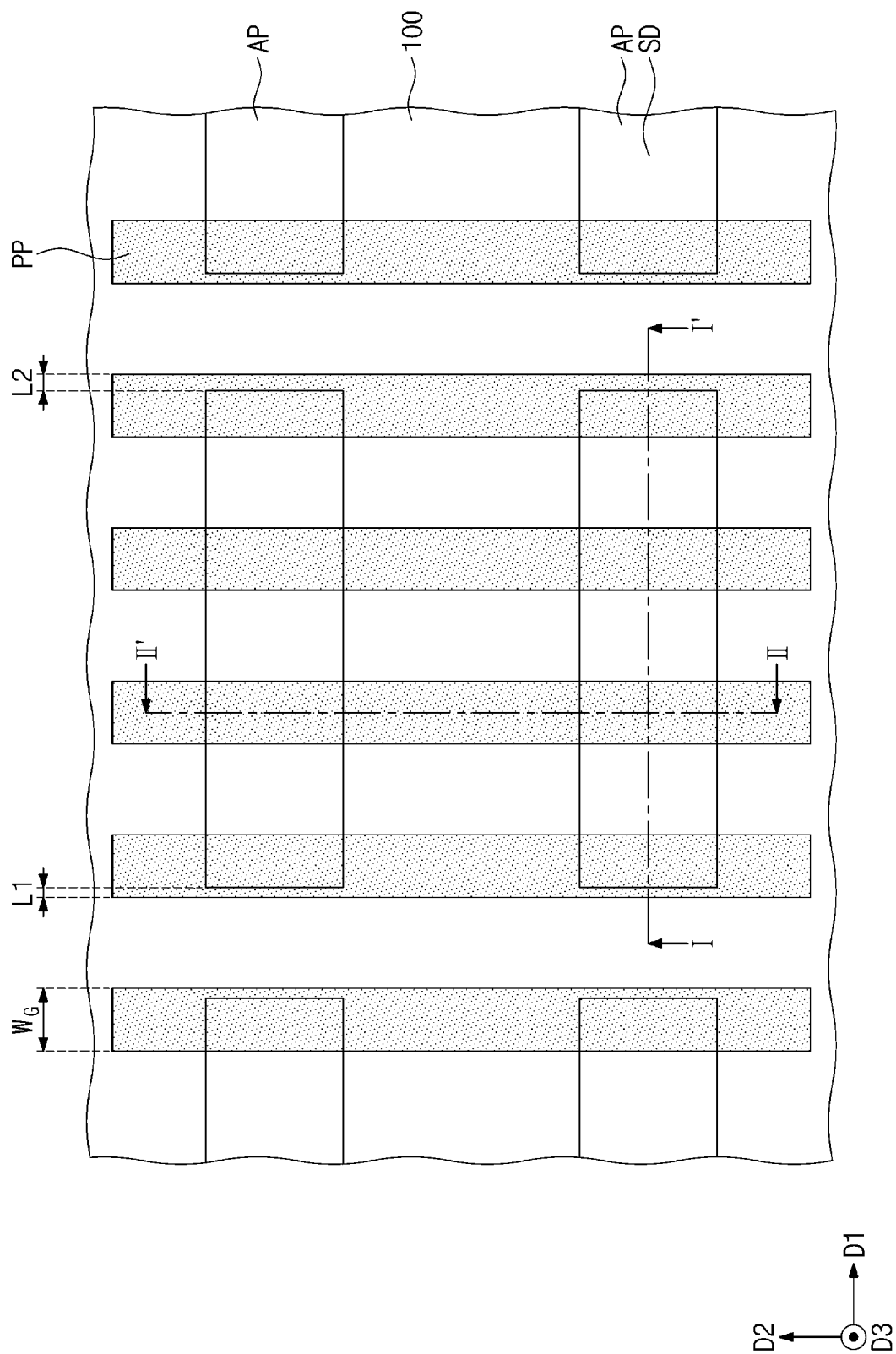
Figure 6B:
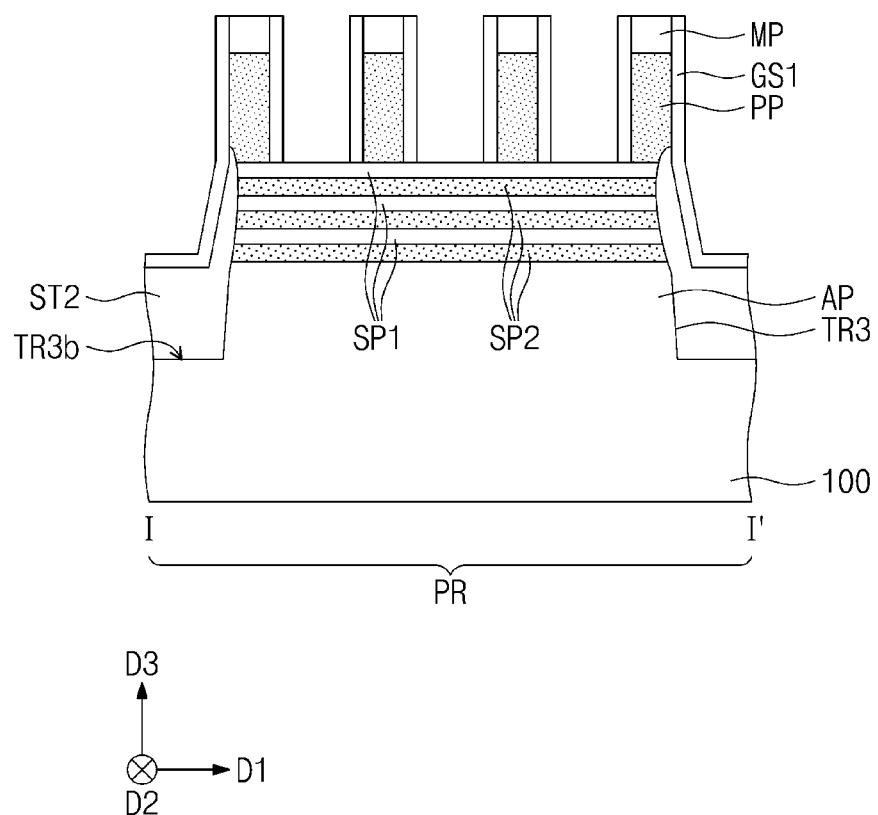

Referring to FIGS. 6A and 6B, a third etching process may be performed to form a third trench TR3 that divides the active patterns AP into separate pieces in the first direction D1. The third etching process may include, for example, at least one wet etching process and at least one dry etching process. According to an exemplary embodiment of the present inventive concept, during the third etching process, the second semiconductor pattern SP2 may be recessed more than the first semiconductor patterns SP1.

The third trench TR3 may form a plurality of active patterns AP that are spaced apart from each other in the first direction D1 in each of the first cell region PR and the second cell region NR. The third trench TR3 may be formed shallower than the second trench TR2, but this is merely an example and the present inventive concept is not limited thereto.

A second device isolation layer ST2 may be formed on the substrate 100 and may fill the third trench TR3. The second device isolation layer ST2 may include a dielectric material the same as that of the first device isolation layer ST1. The formation of the second device isolation layer ST2 may include filling the third trench TR3 with a dielectric material and recessing the second device isolation layer ST2 until a top surface of the second device isolation layer ST2 is located at the same level as that of a top surface of the first device isolation layer ST1. Afterwards, at least a portion of the second device isolation layer ST2 may remain while covering sidewalls of the first and second semiconductor patterns SP1 and SP2.

The sacrificial patterns PP may be partially etched during the formation of the third trench TR3. For example, the sacrificial pattern PP adjacent to the third trench TR3 may be partially etched on a lower portion thereof, and the second device isolation layer ST2 may fill an etched spaced.

Afterwards, first gate spacers GS1 may be formed to cover opposite sidewalls of each of the sacrificial patterns PP. A portion of the first gate spacer GS1 may extend downwardly from bottom surfaces of the sacrificial pattern PP to extend onto the top surface of the second device isolation layer ST2.

The formation of the first gate spacers GS1 may include forming a first gate spacer layer that covers a top surface of an uppermost one of the first semiconductor patterns SP1, a top surface of the hardmask pattern MP, sidewalls of the hardmask pattern MP and the sacrificial pattern PP, and the top surface of the second device isolation layer ST2, and then removing the first gate spacer layer from the top surface of the uppermost one of the first semiconductor patterns SP1 and the top surface of the hardmask pattern MP. The first gate spacers GS1 may include, for example, silicon nitride.

Figure 7A:
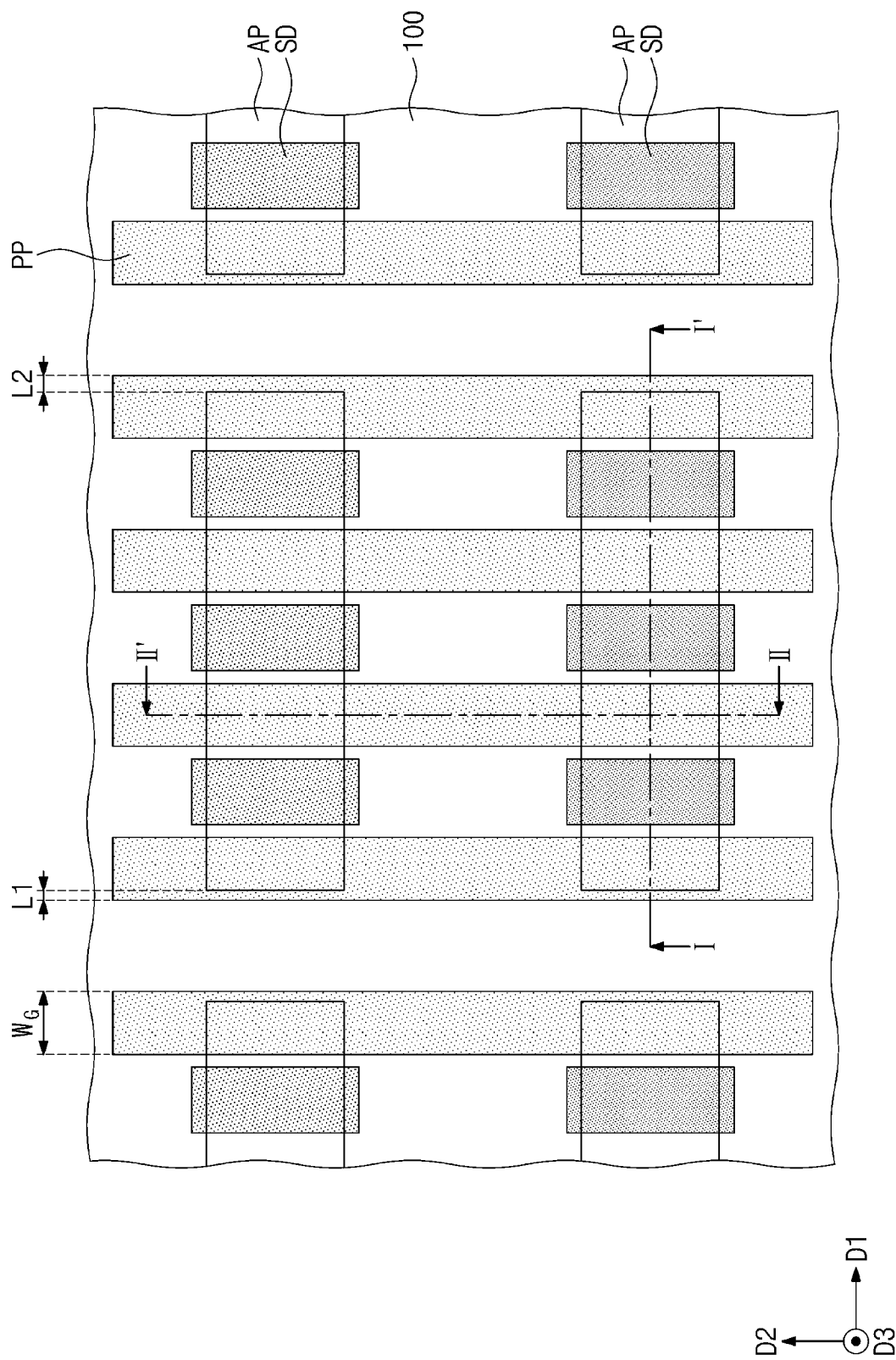
Figure 7B:
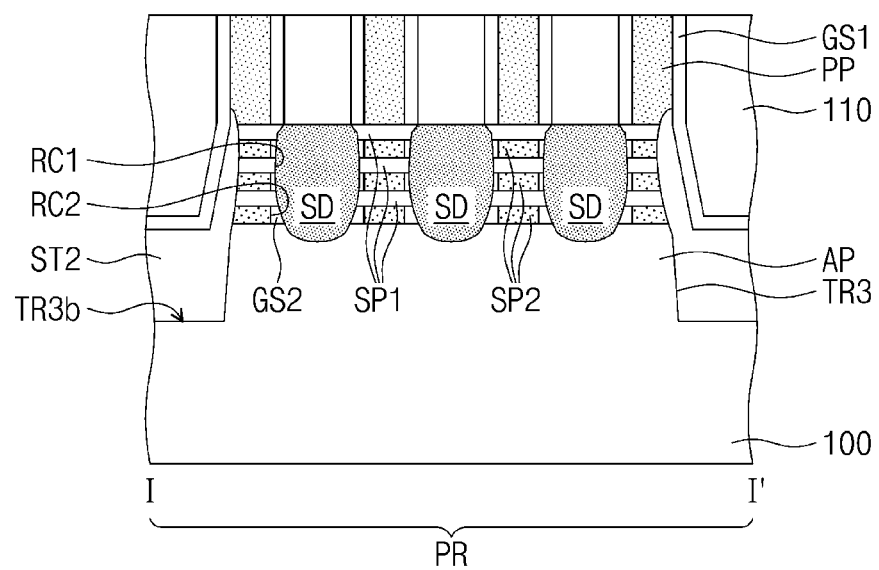
Figure 7B:
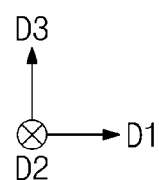

Referring to FIGS. 7A and 7B together with FIG. 6B, the active patterns AP may be partially recessed to form first recessions RC1. The first recessions RC1 may be formed on opposite sides of the sacrificial pattern PP. The first recessions RC1 may be formed by using the hardmask pattern MP and the first gate spacers GS1 as an etching mask to etch an upper portion of each of the active patterns AP.

The second semiconductor patterns SP2 may have parts exposed to the first recessions RC1, and the exposed parts may be recessed in the first direction D1 to form second recessions RC2. The first semiconductor patterns SP1 exposed to the first recessions RC1 might not be removed during the formation of the second recessions RC2. Second gate spacers GS2 may be formed in the second recessions RC2. The formation of the second gate spacers GS2 may include forming a second gate spacer layer that covers inner sidewalls of the first and second recessions RC2, and removing a portion of the second gate spacer layer formed in the first recessions RC1. The second gate spacers GS2 may include, for example, silicon nitride. However, according to an exemplary embodiment of the present inventive concept, neither the second recessions RC2 nor the second gate spacers GS2 may be formed.

Source/drain patterns SD may be formed to fill the first recessions RC1 on upper portions of the active patterns AP. A pair of source/drain patterns SD may be formed on opposite sides of the sacrificial pattern PP.

A selective epitaxial growth process may be performed in which the first semiconductor patterns SP1 and top surfaces of the active patterns AP exposed to the first recessions RC1 are used as seeds to form the source/drain patterns SD. For example, impurities may be in-situ implanted during the selective epitaxial growth process for forming the source/drain patterns SD. For another example, impurities may be implanted after the formation of the source/drain patterns SD. According to an exemplary embodiment of the present inventive concept, the source/drain patterns SD may have their top surfaces located at a level higher than that of the top surface of the first device isolation layer ST1 and that of the top surfaces of the active patterns AP, and the top surfaces of the source/drain patterns SD may be externally exposed.

A first interlayer dielectric layer 110 may be formed to cover sidewalls and top surfaces of the source/drain patterns SD and also to cover sidewalls and top surfaces of the first gate spacers GS1.

Thereafter, a planarization process may be performed until the top surfaces of the sacrificial patterns PP are exposed. The planarization process may remove the hardmask pattern MP and a portion of the first interlayer dielectric layer 110 positioned at a level higher than that the top surfaces of the sacrificial patterns PP. The planarization process may be, for example, an etch-back process or a chemical mechanical polishing (CMP) process. After the planarization process, the first interlayer dielectric layer 110 may have a top surface substantially coplanar with those of the sacrificial patterns PP.

Figure 8A:
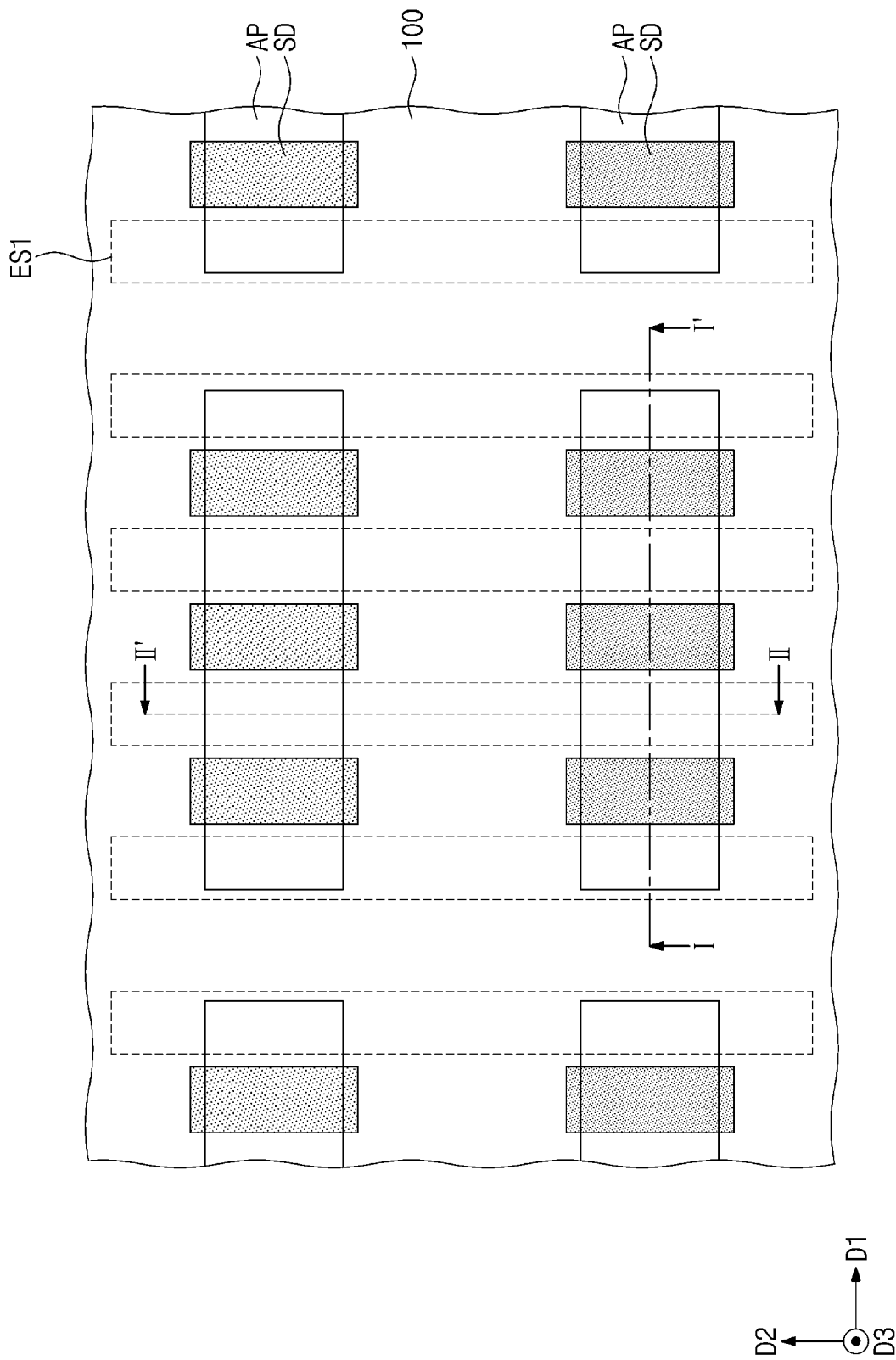
Figure 8B:
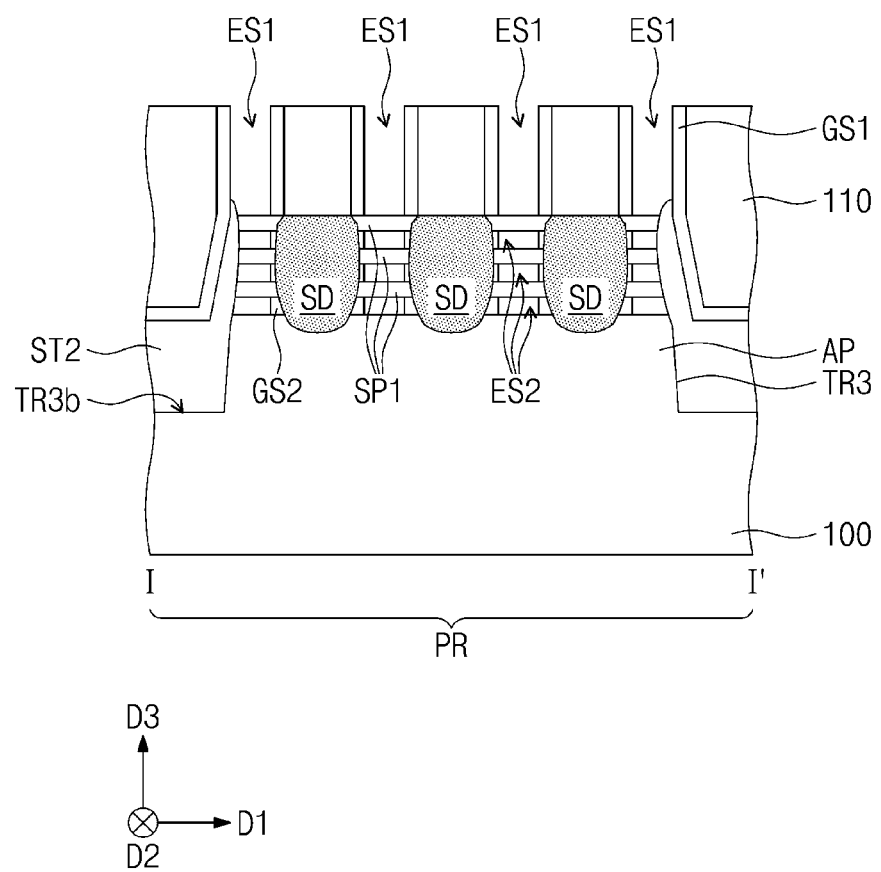
Figure 8C:
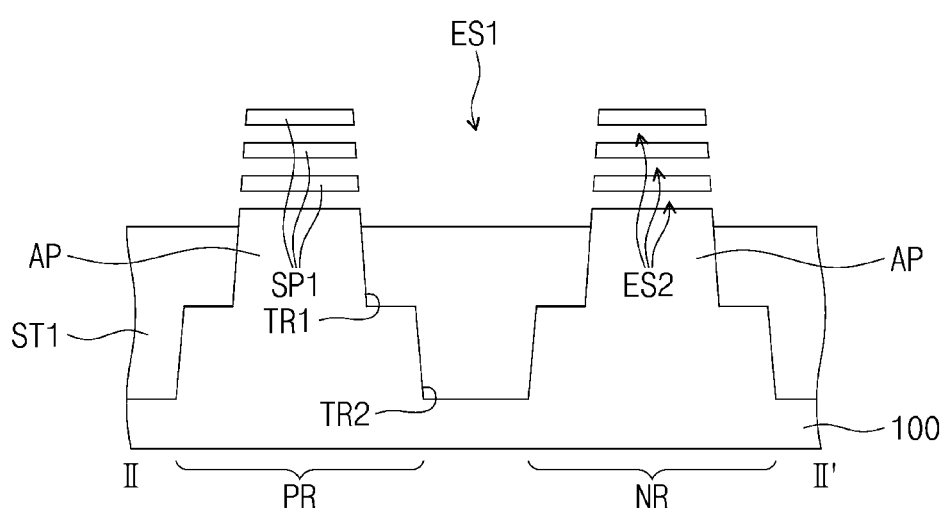
Figure 8C:
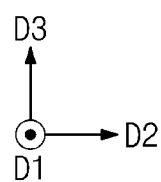

Referring to FIGS. 8A, 8B, and 8C together with FIG. 7B, the sacrificial pattern PP may be selectively removed. The removal of the sacrificial pattern PP may form a first empty space ES1 that exposes a portion of each of the active patterns AP, an uppermost one of the first semiconductor patterns SP1, and inner sidewalls of the first gate spacers GS1. For example, the first empty space ES1 may expose the second semiconductor patterns SP2.

After that, the second semiconductor patterns SP2 may be selectively removed. The second semiconductor patterns SP2 may be selectively removed by an etching process in which the second semiconductor patterns SP2 have their high etch selectivity with respect to the first semiconductor patterns SP1. After the etching process is performed on the second semiconductor patterns SP2, the first semiconductor patterns SP1 may remain without being removed. After the etching process is performed on the second semiconductor patterns SP2, the first and second gate spacers GS1 and GS2 may also remain without being removed. The removal of the second semiconductor patterns SP2 may form second empty spaces ES2. Each of the second empty spaces ES2 may a gap between the first semiconductor patterns SP1 that are adjacent to each other in the third direction D3.

Referring back to FIGS. 1A, 1B, 1C, and 2 together with FIGS. 8B and 8C, a gate electrode GE may be formed to fill the first and second empty spaces ES1 and ES2. A top electrode GEt of the gate electrode GE may at least partially fill the first empty space ES1, and a bottom electrode GEb of the gate electrode GE may at least partially fill the second empty spaces ES2. Before the gate electrode GE is formed, a gate dielectric pattern GI may be formed to conformally cover sidewalls, top surfaces, and bottom surfaces of the first and second empty spaces ES1 and ES2. The first semiconductor patterns SP1 may be called channel layers CH.

Thereafter, a gate capping pattern GP may be formed on the gate electrode GE. The formation of the gate capping pattern GP may include partially recessing the gate electrode GE that fills the first empty space ES1, forming a capping layer that fills a hollow area where the gate electrode GE is recessed, and performing a planarization process to remove a portion of the capping layer. For example, the gate capping layer may be planarized such that a top surface of the gate capping pattern GP is substantially coplanar with top surfaces of the first gate spacers GS1. The gate capping pattern GP may include, for example, silicon nitride. The gate capping pattern GP may have a top surface substantially coplanar with those of the first gate spacers GS1.

Afterwards, active contacts AC may be formed on opposite sides of the gate electrode GE. A second interlayer dielectric layer 120 may be formed to cover the top surface of the first interlayer dielectric layer 110 and the top surface of the gate capping pattern GP. A gate contact GC may be formed to penetrate the second interlayer dielectric layer 120 and the gate capping pattern GP, and may be electrically connected to the gate electrode GE.

A third interlayer dielectric layer 130 may be formed on a top surface of the second interlayer dielectric layer 120, top surfaces of the active contacts AC, and a top surface of the gate contact GC. A first metal layer may be formed in the third interlayer dielectric layer 130, and the first metal layer may include first lines M1, a first via V1, and a second via V2. The first via V1 may be connected to the top surface of the active contact AC. The second via V2 may be connected to the top surface of the gate contact GC. Additional metal layers (e.g., M2, M3, M4, etc.) may be provided on the third interlayer dielectric layer 130.

A semiconductor device according to an exemplary embodiment of the present inventive concept may have an asymmetric structure on first and second sidewalls of an active pattern, and thus it may be possible to minimize or prevent possible manufacturing defects (e.g., electrical short of the source/drain patterns SD or parasitic epitaxial growth of patterns). Accordingly, the semiconductor device according to an exemplary embodiment of the present inventive concept may increase in yield, electrical properties, and reliability.

While the present inventive concept has been particularly shown and described with reference to example embodiments thereof, it will be apparent to those of ordinary skill in the art that various changes in form and detail may be made thereto without departing from the spirit and scope of the present inventive concept.

What is claimed is:

1. A semiconductor device, comprising:
   an active pattern on a substrate, wherein the active pattern includes a plurality of channel layers that are stacked on one another and spaced apart from each other;
   a plurality of source/drain patterns that are spaced apart from each other in a first direction and are disposed on the active pattern, wherein the plurality of source/drain patterns are connected to each other through the plurality of channel layers; and
   first and second gate electrodes that at least partially surround the channel layers and extend in a second direction while extending across the active pattern, wherein the first and second gate electrodes are disposed adjacent to the plurality of source/drain patterns, wherein the second direction intersects the first direction,
   wherein the active pattern has a first sidewall and a second sidewall that faces the first sidewall, and
   wherein a first distance between the first sidewall of the active pattern and an outer sidewall of the first gate electrode is different from a second distance between the second sidewall of the active pattern and an outer sidewall of the second gate electrode.

2. The semiconductor device of claim 1, wherein each of the first distance and the second distance is less than a width in the first direction of each of the first and second gate electrodes.

3. The semiconductor device of claim 2, wherein each of the first distance and the second distance is less than about half of the width in the first direction of each of the first and second gate electrodes.

4. The semiconductor device of claim 1, wherein the active pattern is provided in plural,
   wherein the plurality of active patterns are spaced apart from each other in the first direction by a plurality of trenches,
   wherein the plurality of trenches are filled with a device isolation layer, and
   wherein the device isolation layer extends along the first sidewall and the second sidewall.

5. The semiconductor device of claim 4, wherein each of the first and second gate electrodes includes:
   a top electrode on an uppermost one of the channel layers; and
   a bottom electrode between the channel layers, and
   wherein the device isolation layer overlaps in the first direction with at least a portion of the top electrode of the first gate electrode and with at least a portion of the top electrode of the second gate electrode.

6. The semiconductor device of claim 1, wherein each of the first and second gate electrodes includes:
   a top electrode on an uppermost one of the channel layers; and
   a bottom electrode between the channel layers,
   wherein the bottom electrode of the first gate electrode includes a first part and a second part stacked with one of the channel layers interposed therebetween,
   wherein a width of the first part of the bottom electrode is different from a width of the second part of the bottom electrode.

7. The semiconductor device of claim 6, wherein the top electrode of the first gate electrode includes:
   a first part adjacent to the bottom electrode; and
   a second part on the first part,
   wherein a width of the second part of the top electrode is greater than a width of the first part of the top electrode.

8. The semiconductor device of claim 6, wherein the bottom electrode of the second gate electrode includes a third part and a fourth part stacked with one of the channel layers interposed therebetween,
   wherein a width of the third part of the bottom electrode is different from a width of the fourth part of the bottom electrode.

9. The semiconductor device of claim 8, wherein
   the width of the first part of the bottom electrode included in the first gate electrode is different from the width of the third part of the bottom electrode included in the second gate electrode, and
   the width of the second part of the bottom electrode included in the first gate electrode is different from the width of the fourth part of the bottom electrode included in the second gate electrode.

10. The semiconductor device of claim 1, further comprising a plurality of gate spacers that cover sidewalls of the first and second gate electrodes,
    wherein first gate spacers of the gate spacers covers the outer sidewall of the first gate electrode and the outer sidewall of the second gate electrode, and extends downwardly from a top surface of an uppermost one of the channel layers.

11. A semiconductor device, comprising:
    an active pattern on a substrate, wherein the active pattern includes a plurality of channel layers that are stacked and spaced apart from each other;
    a plurality of source/drain patterns spaced apart from each other in a first direction and disposed on the active pattern, wherein the plurality of source/drain patterns are connected to each other through the channel layers; and
    first to third gate electrodes that at least partially surround the channel layers and extend in a second direction while extending across the active pattern, wherein the first to third gate electrode are disposed between the plurality of source/drain patterns, wherein the second direction intersects the first direction,
    wherein the active pattern has a first sidewall and a second sidewall that faces the first sidewall,
    wherein each of the first sidewall and the second sidewall has a curved shape that is rounded toward an adjacent one of the plurality of source/drain patterns,
    wherein the first gate electrode is adjacent to the first sidewall,
    wherein the second gate electrode is adjacent to the second sidewall,
    wherein the third gate electrode is between the first gate electrode and the second gate electrode, and
    wherein a first distance between the first sidewall and an outer sidewall of the first gate electrode is less than a second distance between the second sidewall and an outer sidewall of the second gate electrode.

12. The semiconductor device of claim 11, wherein a curvature of the first sidewall is different from a curvature of the second sidewall.

13. The semiconductor device of claim 11, wherein each of the first sidewall and the second sidewall has an embossed curved shape.

14. The semiconductor device of claim 11, wherein each of the first to third gate electrodes includes:
    a top electrode on an uppermost one of the channel layers; and
    a bottom electrode between the channel layers, wherein the bottom electrode of the first gate electrode includes a first part and a second part stacked with one of the channel layers interposed therebetween, wherein the bottom electrode of the second gate electrode includes a third part and a fourth part stacked with one of the channel layers interposed therebetween, wherein a width of the first part of the bottom electrode is greater than a width of the second part of the bottom electrode, and wherein a width of the third part of the bottom electrode is greater than a width of the fourth part of the bottom electrode.

15. The semiconductor device of claim 14, wherein
the first and second parts of the bottom electrode of the first gate electrode have a curved shape that is rounded along a profile of the first sidewall, and
the third and fourth parts of the bottom electrode of the second gate electrode have a curved shape that is rounded along a profile of the second sidewall.

16. The semiconductor device of claim 14, wherein
the width of the first part of the bottom electrode of the first gate electrode is greater than the width of the third part of the bottom electrode of the second gate electrode, and
the width of the second part of the bottom electrode of the first gate electrode is greater than the width of the fourth part of the bottom electrode of the second gate electrode.

17. A semiconductor device, comprising:
a plurality of active patterns on a substrate, wherein each of the active patterns includes a plurality of channel layers that are stacked and spaced apart from each other;
a plurality of source/drain patterns spaced apart from each other in a first direction and disposed on the plurality of active patterns, wherein the plurality of source/drain patterns are connected to each other through the plurality of channel layers;
first to third gate electrodes at least partially surrounding the channel layers and extending in a second direction across the plurality of active patterns, wherein the plurality of source/drain patterns are disposed between the first to third gate electrodes, wherein the second direction intersects the first direction;
a gate dielectric pattern between the first to third gate electrodes and the plurality of channel layers;
a plurality of first gate spacers vertically extending from a top surface of an uppermost one of the channel layers and covering sidewalls of each of the first to third gate electrodes;
a plurality of second gate spacers between the plurality of source/drain patterns and the first to third gate electrodes, wherein the plurality of second gate spacers vertically overlap the plurality of first gate spacers;
a plurality of gate capping patterns between the plurality of first gate spacers and on the first to third gate electrodes;
an interlayer dielectric layer covering sidewalls and top surfaces of the plurality of first gate spacers and top surfaces of the plurality of gate capping patterns;
a plurality of active contacts on opposite sides of each of the first to third gate electrodes, wherein the active contacts penetrate the interlayer dielectric layer and are connected to the plurality of source/drain patterns; and
a gate contact penetrating the interlayer dielectric layer to connect to one of the first to third gate electrodes,
wherein the plurality of active patterns are spaced apart from each other in the second direction by a first trench, and are spaced apart from each other in the first direction by a second trench,
wherein each of the plurality of active patterns has a first sidewall and a second sidewall that faces the first sidewall,
wherein each of the first sidewall and the second sidewall has a curved shape that is rounded toward an adjacent one of the plurality of source/drain patterns,
wherein the first gate electrode is adjacent to the first sidewall,
wherein the second gate electrode is adjacent to the second sidewall,
wherein the third gate electrode is between the first gate electrode and the second gate electrode, and
wherein a first distance between the first sidewall and an outer sidewall of the first gate electrode is less than a second distance between the second sidewall and an outer sidewall of the second gate electrode.

18. The semiconductor device of claim 17, wherein a bottom surface of the second trench is at a level lower than a level of a bottom surface of the first trench.

19. The semiconductor device of claim 17, further comprising:
a first device isolation layer filling the first trench; and
a second device isolation layer filling the second trench,
wherein the second device isolation layer extends along the first sidewall and the second sidewall of each of the plurality of active patterns,
wherein at least a portion of the second device isolation layer protrudes upwardly from the top surface of the uppermost one of the channel layers, and
wherein the second device isolation layer is adjacent to at least one of the first gate electrode or the second gate electrode.

20. The semiconductor device of claim 19, wherein one of the plurality of first gate spacers covers the outer sidewall of the first gate electrode and the outer sidewall of the second gate electrode, and extends along a top surface of the second device isolation layer.

* * * * *